(12) United States Patent
McLeod et al.

(10) Patent No.: US 8,697,346 B2
(45) Date of Patent: Apr. 15, 2014

(54) DIFFRACTION UNLIMITED PHOTOLITHOGRAPHY

(75) Inventors: Robert R. McLeod, Boulder, CO (US); Christopher N. Bowman, Boulder, CO (US); Timothy F. Scott, Boulder, CO (US); Amy C. Sulivan, Decatur, GA (US)

(73) Assignee: The Regents of the University of Colorado, Denver, CO (US)

( * ) Notice: Subject to any disclaimer, the term of this patent is extended or adjusted under 35 U.S.C. 154(b) by 276 days.

(21) Appl. No.: 13/078,485

(22) Filed: Apr. 1, 2011

(65) Prior Publication Data

US 2012/0092632 A1 Apr. 19, 2012

Related U.S. Application Data

(60) Provisional application No. 61/319,932, filed on Apr. 1, 2010.

(51) Int. Cl.
  *G03F 7/00* (2006.01)
  *G03F 7/20* (2006.01)

(52) U.S. Cl.
  USPC .......... 430/394; 430/270.1; 430/396; 430/913

(58) Field of Classification Search
  USPC ................................ 430/270.1, 394, 396, 913
  See application file for complete search history.

(56) References Cited

U.S. PATENT DOCUMENTS

| | | | | |
|---|---|---|---|---|
| 4,734,746 A * | 3/1988 | Ushida et al. ............... 355/53 |
| 5,182,056 A * | 1/1993 | Spence et al. ............. 264/401 |
| 5,236,326 A * | 8/1993 | Grossa ..................... 425/174.4 |
| 5,811,222 A * | 9/1998 | Gardner et al. ............. 430/312 |
| 6,291,145 B1 * | 9/2001 | Kokubo et al. ............. 430/394 |
| 6,558,881 B2 * | 5/2003 | Tokushima ................. 430/394 |
| 6,740,475 B2 * | 5/2004 | Richter et al. .............. 430/322 |
| 6,864,185 B2 * | 3/2005 | Yang et al. ................. 438/736 |
| 6,879,376 B2 * | 4/2005 | Case et al. ..................... 355/53 |
| 6,913,872 B1 * | 7/2005 | Sturtevant et al. .......... 430/322 |
| 6,936,406 B2 * | 8/2005 | Hasegawa et al. .......... 430/311 |
| 7,011,936 B2 * | 3/2006 | Nolscher et al. ............ 430/394 |
| 7,217,503 B2 * | 5/2007 | Saitoh et al. ................ 430/311 |
| 7,914,974 B2 * | 3/2011 | Guerrero et al. ............ 430/312 |
| 8,236,483 B2 * | 8/2012 | Ando et al. ................. 430/322 |
| 8,383,316 B2 * | 2/2013 | Cooper et al. ............ 430/270.1 |
| 2003/0104319 A1 * | 6/2003 | Lin et al. .................... 430/313 |
| 2005/0181313 A1 * | 8/2005 | Shih et al. ................... 430/394 |
| 2005/0202352 A1 * | 9/2005 | Cyganski et al. ........... 430/394 |
| 2008/0175348 A1 * | 7/2008 | Marconi et al. ............... 378/34 |
| 2011/0039213 A1 * | 2/2011 | Fourkas et al. ............. 430/322 |

* cited by examiner

*Primary Examiner* — Amanda C. Walke
(74) *Attorney, Agent, or Firm* — Maschoff Brennan

(57) ABSTRACT

Methods, devices, systems, and materials are disclosed for diffraction unlimited photofabrication. A method is provided where a photoresponsive material is illuminated with a first optical pattern at a first wavelength of light. The first wavelength of light alters a solubility of the photoresponsive organic material. The photoresponsive material is also illuminated with a second optical pattern at a second wavelength of light. The second wavelength of light hinders the ability of the first wavelength of light to alter the solubility of the photoresponsive organic material where the second optical pattern overlaps the first optical pattern. The photoresponsive organic material is then developed.

23 Claims, 11 Drawing Sheets

The synthetic route and photolysis products of bis(2,2,6,6-tetramethylpiperidyl-(1))-disulfide.

DIFFRACTION UNLIMITED PHOTOLITHOGRAPHY

CROSS-REFERENCES TO RELATED APPLICATIONS

This application is a non-provisional of, and claims the benefit of, U.S. Provisional Patent Application Ser. No. 61/319,932, entitled "DIFFRACTION UNLIMITED PHOTOLITHOGRAPHY," filed Apr. 1, 2010, the entire disclosure of which is incorporated herein by reference for all purposes.

STATEMENT REGARDING FEDERALLY FUNDED RESEARCH

This invention was made with Government support under grant number DE010959 awarded by the National Institutes of Health. The government has certain rights in the invention.

BACKGROUND

This application relates generally to photofabrication. More specifically, this application relates to diffraction unlimited photofabrication methods, systems, devices, and materials.

Photofabrication, and more specifically photolithography, can be limited by diffraction. In order to form smaller and smaller features, one generally can resort to using shorter wavelengths of light or increasing the numerical aperture of the lenses used in a photofabrication system. While these two approaches can reduce the diffraction limit, they also can come with increasing costs.

Alternative techniques have been developed to try to get beyond the diffraction limitations found in photofabrication. Two photon and threshold approaches can provide avenues to decreasing feature size. However, these too have problems. Techniques using two photon photoresists, for example, can be inefficient. Furthermore, two photon photoresists may not be conducive to projection-based photolithography techniques using masks. Threshold approaches also face problems because they can rely on being a function of a summation of patterns, which can put limits on decreasing feature size.

BRIEF SUMMARY

Embodiments are provided related to photofabrication methods, devices, systems, and/or materials that can be utilized for diffraction unlimited photolithography that can avoid the cited problems. In a first set of embodiments, methods are provided for photofabrication that are diffraction unlimited. A photoresponsive material is illuminated with a first optical pattern at a first wavelength of light. The first wavelength of light alters a solubility of the photoresponsive material though the interaction of the first wavelength of light with a photoinitiator of the photoresponsive material. The photoresponsive material is also illuminated with a second optical pattern at a second wavelength of light. The second wavelength of light hinders the ability of the first wavelength of light to alter the solubility of the photoresponsive material through the interaction of the second wavelength of light with a photoinhibitor of the photoresponsive material. The second optical pattern overlaps the first optical pattern. The photoresponsive material is then developed.

In some embodiments, a method may use a second optical pattern that is Gauss-Laguerre pattern. In some embodiments, a method may utilize direct-write illumination. In other embodiments, a method may utilize mask-based illumination.

In other embodiments, a photoresponsive organic material is provided that may be utilized with diffraction unlimited photofabrication. In some embodiments, the photoresponsive organic material includes a carbon-based molecule. In addition, the photo-responsive organic material includes a photoinitiator. The photoinitiator can alter the solubility of the carbon-based molecule when the photoinitiator is exposed to a first wavelength of light. The photoresponsive organic material also includes a photoinhibitor. The photoinhibitor can hinder the ability of the photoinitiator to alter the solubility of the carbon-based molecule when the photoinhibitor is exposed to a second wavelength of light.

In some embodiments, a photoresponsive organic material includes a carbon-based molecule that is a monomer. In some embodiments, a photoresponsive organic material includes a silicon-based monomer. A silicon-based monomer may be a siloxane monomer. In some embodiments, a photoresponsive organic includes a photoinitiator that alters the solubility of the carbon-based molecule through production of free radicals when the photoinitiator is exposed to the first wavelength of light. In some embodiments, a photoresponsive organic material includes a photoinhibitor that hinders the ability of the photoinitiator to alter the solubility of the carbon-based molecule through the absorption of free radicals when the photoinhibitor is exposed to the second wavelength of light.

In other embodiments, the photoresponsive organic material includes a monomer that is triethylene glycol dimethacrylate. In some embodiments, a photoresponsive organic material includes a photoinitiator that is a combination of a camphorquinone and ethyl 4-(dimethylamino)benzoate. In some embodiments, a photoresponsive organic material includes a photoinhibitor that is tetraethylthiuram disulfide. In some embodiments, a photoresponsive organic material includes a photoinhibitor that is a bis(dialkylamino)disulfide.

Some embodiments includes a system for photofabrication. In one embodiment, a system for photofabrication includes a first source of light at a first wavelength and a second source of light at a second wavelength. The system may include one or more first projecting components that are configured to project the first wavelength of light onto a photoresponsive organic material in a first pattern. The photoresponsive material includes photointitiator and a photoinhibitor. The system also includes one or more second projecting components that are configured to project the second wavelength of light onto the photoresponsive organic material as a second pattern. The second pattern overlaps the first pattern. The first projecting components may share some components with the second projecting components.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments provide devices, methods, systems, and materials for photofabrication that can create features not limited by the physics of diffraction. A projected optical pattern initiates polymerization or a solubility change in a photoresist, photopolymer, or more generally, a photoresponsive organic material. A second optical pattern in a different color is superimposed to inhibit and spatially restrict polymerization or solubility change. In some embodiments, superimposition occurs at a periphery. A final feature size and shape may therefore be given by the difference of the initiating pattern and the inhibiting pattern. This difference may not be limited by diffraction like traditional photolithography or photofabrication in general. The limit may now be given by the contrast ratio that can be maintained between initiation and inhibition. This contrast limit may be determined by both the chemistry of the two-color photoresist and/or the optics of the two-color photolithography hardware.

Figure 1:
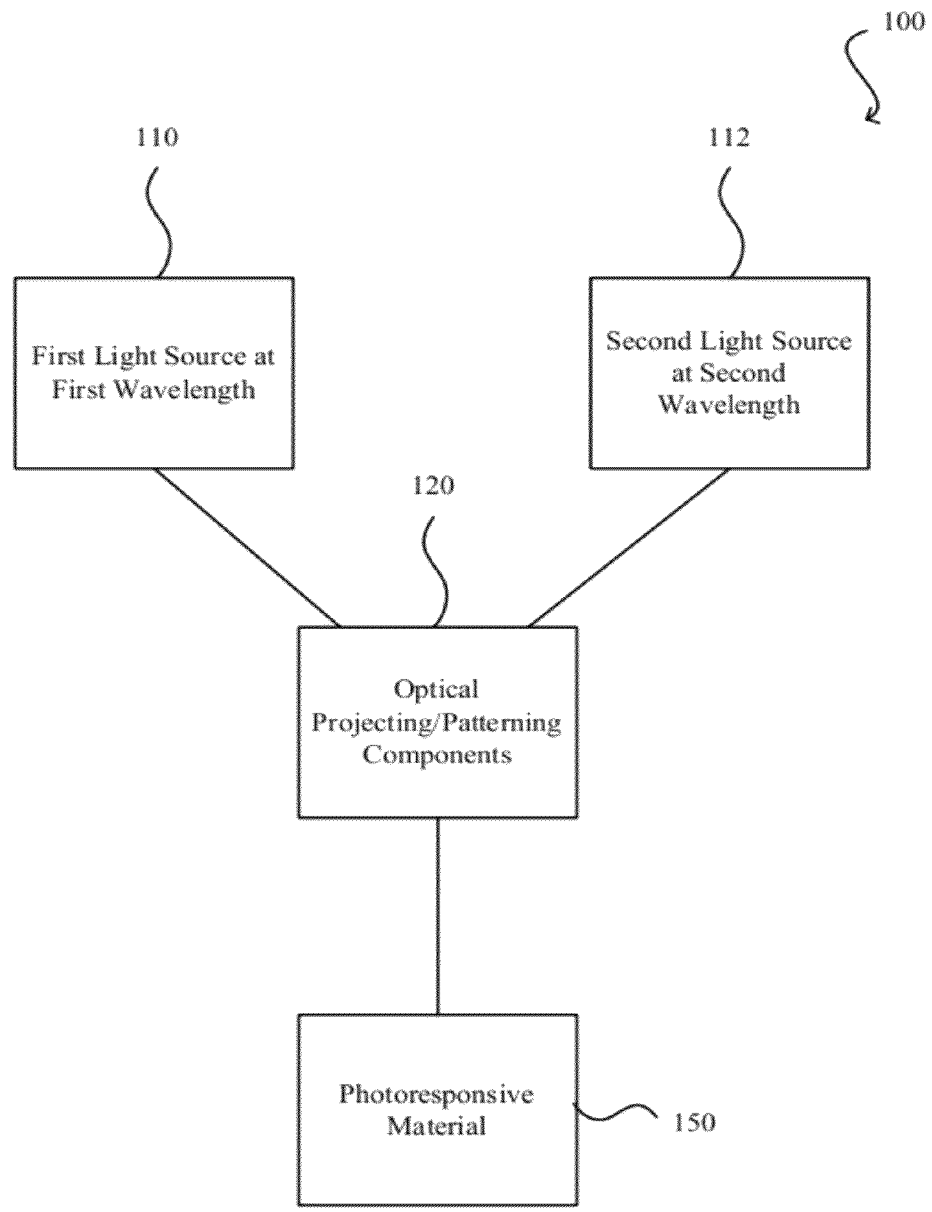
FIG. 1 shows a system for diffraction unlimited photolithography in accordance with various embodiments.

FIG. 1 provides an overview of a general system 100 that may be utilized for diffraction unlimited photolithography in accordance with various embodiments. System 100 includes a first light source 110 that produces light at a first wavelength and a second light source 112 that produces light at a second wavelength. System 100 also includes optical projecting and/or patterning components 120. Components 120 may include, but are not limited to, lenses, filters, holograms, and/or other components that may be utilized to project and/or pattern the light from light sources 110 and/or 112. For example, some aspects of components 120 may be utilized to create and/or project a first optical pattern using light from the first light source 110 onto a photoresponsive material 150 that may initiate a solubility change of the photoresponive material. Some aspects of components 120 may be utilized to create and/or project a second optical pattern using light from the second light source 112 to overlap at least portions of the first optical pattern. The second optical pattern may inhibit the solubility change of the photoresponsive material 150.

Embodiments of system 100 may include both mask-less (e.g., direct-write) and/or mask-based photolithography apparatuses, methods, systems, and materials. In addition, embodiments may include more general photofabrication apparatuses, methods, and systems for stereolithographic and data storage applications.

In some embodiments, a single photon diffraction unlimited direct-write photolithography may be performed using an optical train derived from the stimulated emission-depletion ("STED") microscope. A STED microscope typically operates by scanning one wavelength focused to a point to excite fluorophores. A second wavelength, manipulated into the 'donut' ("Gauss-Laguerre") mode and overlapping the focal point, may then used to deplete the excited state of the fluorophore at the periphery of the spot excited by the first wavelength. The fluorescent spot size may be arbitrarily decreased by increasing the power of the second wavelength, thus resolving features far smaller than the diffraction limit.

In some embodiments, an analogous approach to the STED may be applied to photolithography and more generally to photofabrication. Embodiments of diffraction unlimited photolithography may involve using one wavelength to initiate polymerization while a second, overlapping wavelength prevents polymerization at a periphery, thus achieving diffraction unlimited feature sizes.

In some embodiments, a first wavelength of light may be focused on a photoresponsive organic material, inducing a change in the solubility of the photoresponsive organic material. This change in solubility may be referred to as photoinitiation. A second, different wavelength of light may be focused on photoresponsive organic material to slow, hinder, and/or stop the change in solubility of photoresponsive organic material. The slowing, hindering, or stopping of the change in solubility may be referred to as photoinhibition.

In some embodiments, different patterns of light for two different wavelengths of light may be used. The patterns may overlap in different configurations. For example, in some embodiments, one wavelength of light would form a Gaussian profile or mode, while the other wavelength of light would form a donut shaped, or Gauss-Laguerre profile or mode, centered on the Gaussian profile of the other wavelength of light. In some embodiments, a topological phase discontinuity may be used to ensure a maximally dark null for a second blocking wavelength. As one skilled in the art will realize, numerous different overlapping patterns may be utilized in order to achieve different photofabrication results as desired. For example, in one embodiment, a first wavelength of light may form a linear pattern, while a second wavelength of light may overlap the linear pattern on either or both sides of the linear pattern in order to reduce the resulting width of a photofabrication product.

Figure 2A:
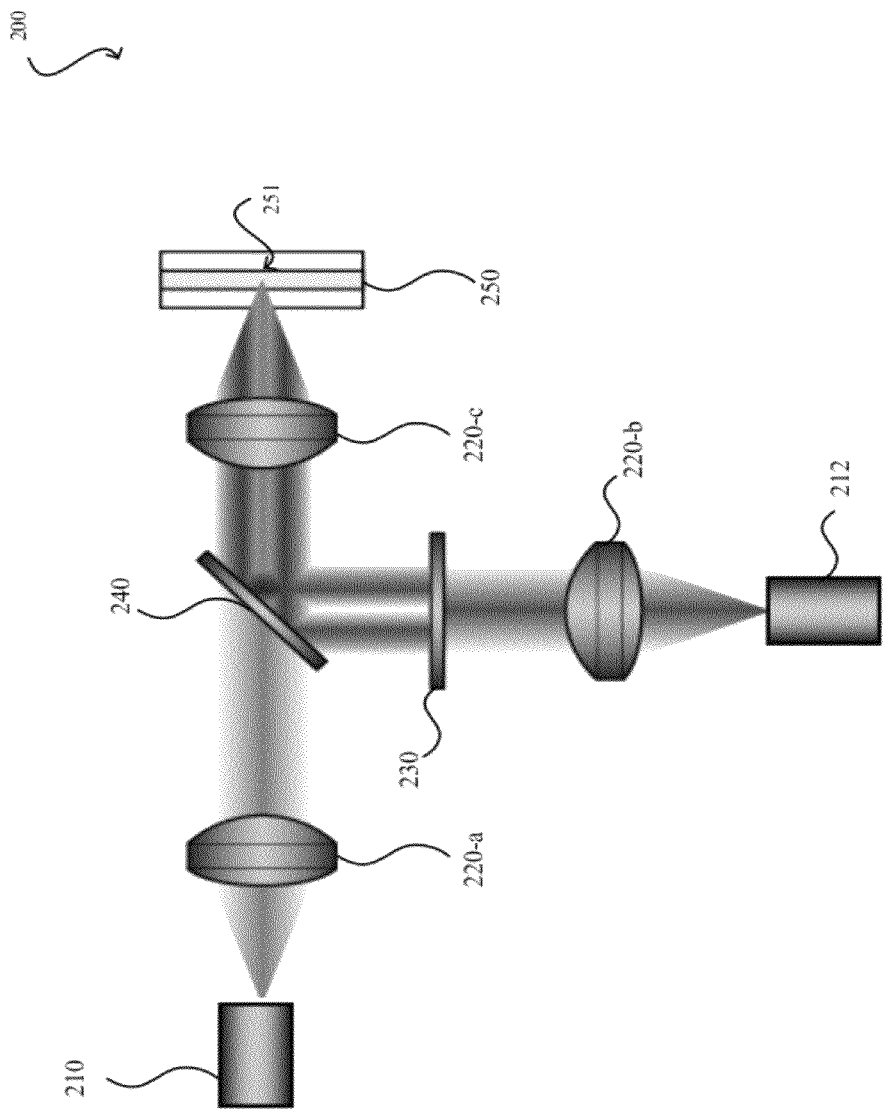
FIG. 2A shows direct-write illumination system in accordance with various embodiments.
Figure 2B:
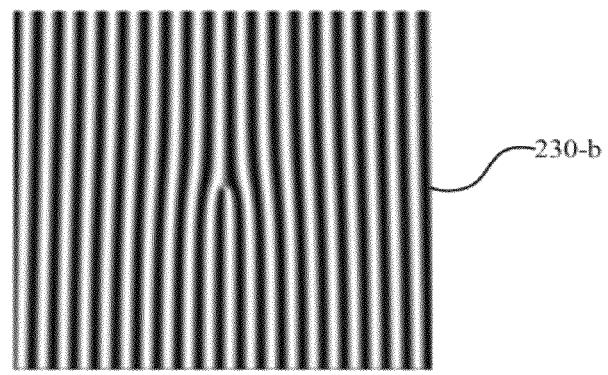
FIG. 2B shows a Gauss-Laguerre binary hologram in accordance with various embodiments.

FIG. 2A shows a system 200 for direct-write photolithography in accordance with various embodiments. System 200 may provide a specific embodiment of system 100 of FIG. 1. System 200 includes a first light source 210 at a first wavelength and a second light source 212 at a second wavelength. One or more optical elements, such as lenses 220-a, 220-b, and 220-c, may be utilized to focus and/or direct the light from these light sources to a photoresponsive material 250. In one example, second light source 212 may be an argon ion laser at a wavelength of 364 nm light. Light from the second light source 212 may be transformed into a Gauss-Laguerre donut mode by a binary amplitude hologram 230. FIG. 2B shows a specific example of a Gauss-Laguerre binary hologram 230-b that may be utilized in systems such as system 200. In one embodiment, this donut mode creates an inhibiting halo that can be combined with light from the first light source 210, which may act as a writing stylus. In one embodiment, the first light source 210 may be diode-pumped solid-state laser, emitting light at 473 nm. Light from the first light source 210 and the second light source 212 can then focused into a photoresist volume 251 by a single objective. Some embodiments may also use a dichroic filter 240 to aid in direct light from the light sources. Other embodiments may utilize other light sources that may include other wavelengths of light.

Figure 2C:
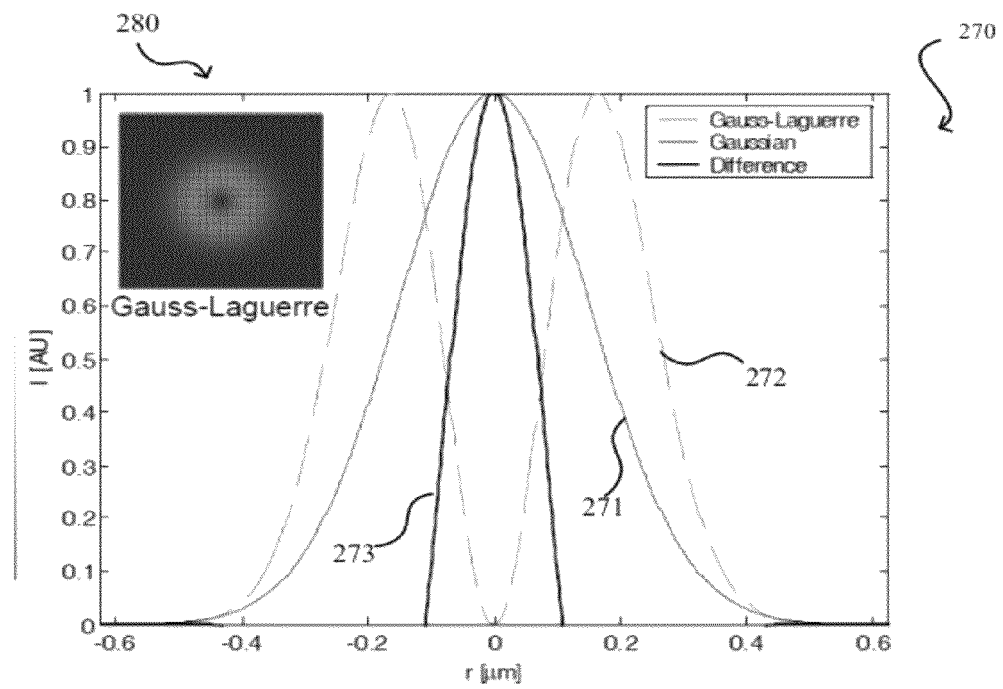
FIG. 2C shows a graph that reflects an initiation profile, an inhibition profile, and a final polymer profile in accordance with various embodiments.

FIG. 2C provides a graph 270 that shows an initiation profile 271, an inhibition profile 272, and a final polymer profile 273 based on utilize a system such as system 200 in accordance to various embodiments. In addition, FIG. 2C shows an example of a Gauss-Laguerre donut mode 280.

In some embodiments, the change in solubility may involve making the photoresponsive organic material more or less soluble in a solvent. The change in solubility may involve making the photoresponsive organic material more or less insoluble in a solvent.

In some embodiments, two overlapping wavelengths may be rapidly drawn around the formulated photoresponsive organic material, photoresists, or photopolymer volume to produce arbitrary three-dimensional objects. Photoinhibition may be rapidly eliminated in the absence of the photoinhibition irradiation wavelength. Such a photoinhibition scheme may be provided by non-initiating radicals produced from the photolysis of an otherwise inert photoinhibitor. Stable radicals incapable of initiating the free radical polymerization of acrylate monomers may be produced by photolysis; these radicals may rapidly recombine with and terminate the growing polymer chain. Additionally, unlike the propagating radicals, the inhibiting radicals are small and their termination kinetics are unconstrained by reaction diffusion. As a result, they may be very short-lived, rapidly recombining with each other, thus their concentration drops precipitously in the absence of photolysing irradiation.

In some embodiments, photoinhibitors and species formed from recombination reactions may be inert. As such, they may not interfere with polymerization reaction so there is no photoinhibition memory effect after the photolysing irradiation has ceased. In some embodiments, the 'donut' of inhibiting radicals to spatially refine the region of polymerization may be drawn with the writing spot without leaving an inhibition 'trail' behind it.

One skilled in the art would recognize that embodiments involving polymerization using free radicals may be generalized to other photoresponsive materials that rely on other mechanisms besides free radical mechanisms to change the solubility of the photoresponsive material. Embodiments within the spirit of this disclosure cover methods, systems, and devices where a first wavelength of light is used to induce a change in the solubility of a photoresponsive organic material, while a second distinct wavelength of light is used to inhibit the change in the solubility of the photoresponsive organic material.

In some embodiments, methods, apparatuses, systems, and/or materials may be applied to mask-based photolithography and more generally photofabrication. Short-lived inhibitors may be used with both the initiating and inhibiting wavelengths being present simultaneously. A projection lens may be sufficiently achromatic to correctly image the mask in both colors in some cases. A mask may simultaneously create the initiating and inhibiting patterns. In some embodiments, multiple masks may be used.

Figure 3A:
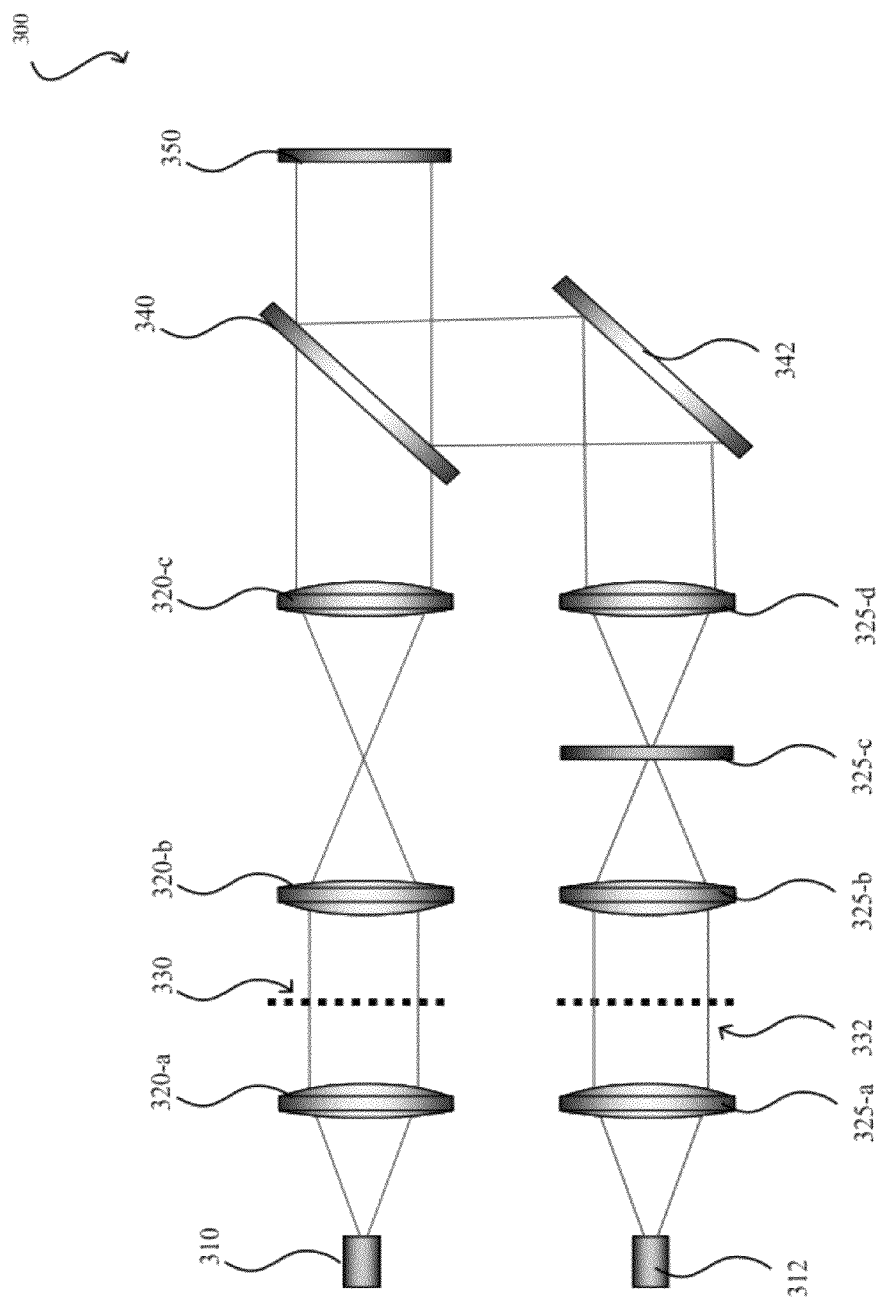
FIG. 3A shows mask-based illumination system in accordance with various embodiments.

FIG. 3A shows a system 300 for mask-based photolithography in accordance with various embodiments. System 300 may provide a specific embodiment of system 100 of FIG. 1. System 300 includes a first light source 310 at a first wavelength and a second light source 312 at a second wavelength. One or more optical elements 320, such as lenses 320-a, 320-b, and 320-c, may be utilized to focus and/or direct the light from light source 310 to a photoresponsive material 350. In addition, mask 330 may be utilized to pattern light from light source 310. This portion of system 300 may create an initiation beam. System 300 includes a second light source 312 at a second wavelength. One or more optical elements 325, such as lenses 325-a, 325-b, 325-c, and 325-d, may be utilized to focus and/or direct the light from light source 312 to a photoresponsive material 350. In addition, mask 332 may be utilized to pattern light from light source 312. This portion of system 300 may create an inhibition beam. System 300 also shows mirror 342 that may direct light from light source 312 that has passed through optical elements 325. In addition, system 300 includes a combiner element 340, which may be a dichroic combiner and/or filter. Some embodiments may utilize different numbers of optical components that may be in different configurations in accordance with various embodiments. System 300 merely provides one possible layout of a two-color mask lithography train using Fourier-plane beam shaping. The beam shaping can be done in numerous ways. Beam shaping could occur on both the initiation and inhibition beams. The masks 330 and 332 may be the same or different. In some embodiments, the two paths can be combined such that only a single mask is used. This may require more sophisticated optics such as a beam shaping element that responds differently to the two colors. Multiple exposures with different masks may be needed to create arbitrary patterns.

Figure 3B:
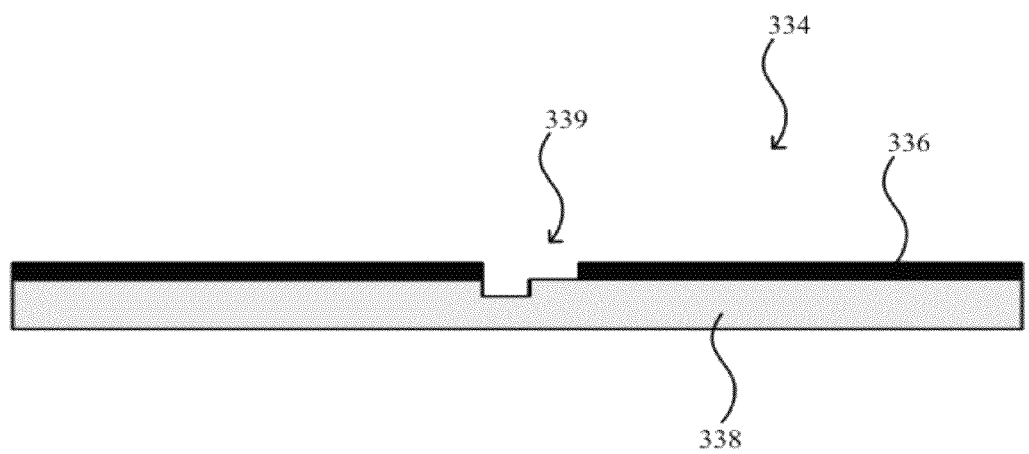
FIG. 3B shows a structural illustration of a two-color mask in accordance with various embodiments.

FIG. 3B shows one example of a photomask 334 that may be utilized in some mask-based implementations. Photomask 334 has been etched with an additional phase step that may be utilized for diffraction unlimited photolithography in accordance with various embodiments. Photomask 334 includes an opaque material 336, which may be chrome in some cases. Photomask 334 may also include a transparent material 338, which may be glass in some cases. Openings in opaque material 336 can admit both the initiating and inhibiting wavelengths. In some embodiments, the phase step may be designed to have minimal effect at the initiating wavelength but to induce a sign change of the electric field in the center of the gap at the inhibiting wavelength. The phase step may introduce a phase delay equal to an integer number of wavelengths in an initiating wavelength and an integer plus one half wavelengths in an inhibiting wavelength. Similar to FIG. 1, a photomask such as 334 may create a line of initiation centered in a "trough" of inhibition. One skilled in the art would recognize that other photomask designs may be used with systems, methods, and/or devices within the spirit of the disclosure.

Some embodiments may involve creating a dense sub-diffraction pattern. For example, initiating and inhibiting patterns may be broken down into a set of exposures for either masked-based or direct-write techniques.

In some embodiments, initiating and inhibiting wavelengths may be applied simultaneously, while in others they may be applied sequentially. Both standard contact or projection lithography may be used for each color in sequence. Merely by way of example, if the inhibiting species is longlived, an inhibition exposure may be used first to create a "virtual mask" on a photoresist or photoresponsive organic material, followed by an initiating exposure which may then restricted in its spatial size.

For any particularly mechanism, there may be possible performance gains in the timing of the applying the first wavelength of light and the second wavelength of light, which may be applied in pulses in some cases. In one embodiment, an initiation pulse can occur before, simultaneous, and/or after the inhibition pulse. The two exposures may have equal duration in some embodiments. The two exposures may have unequal duration in some embodiments. In some cases, the best performance may be found when the two exposures are offset by no more than the exposure duration. In some cases, there may be no reason for a gap between the pulses, which would set the typical maximum range of time offsets. In some embodiments, the inhibition exposure may be most effective if it starts right as the initiation pulse ends. The initiation pulse can start polymerization processes that are typically much longer in duration than the pulse itself. One can apply the initiation pattern during this longer polymerization process and avoid competition that occurs if both initiation and inhibition are simultaneous. Other mechanisms might benefit from different timings in accordance with various embodiments.

In some embodiments, initiating and inhibiting wavelengths may be applied (potentially in either order) at low temperature, which may temporarily slow the chemical processes. After sequential exposure, the temperature may be raised to allow polymerization to proceed. In some embodiments, initiating and inhibiting wavelengths may be chosen because initiating wavelength does not cause much response that is intended from inhibiting wavelength. In some embodiments, initiating and inhibiting wavelengths may be chosen because inhibiting wavelength does not cause much response that is intended from initiating wavelength. In some embodiments, initiating and inhibiting wavelengths act nearly independently.

Figure 4A:
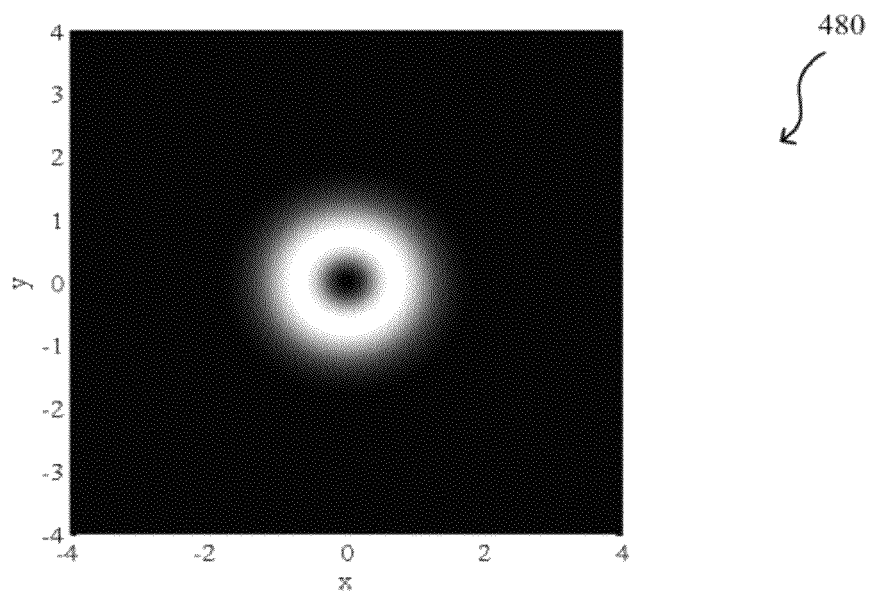
FIG. 4A shows an isolated dot that can be produced with Gauss-Laguerre mode in accordance with various embodiments.
Figure 4B:
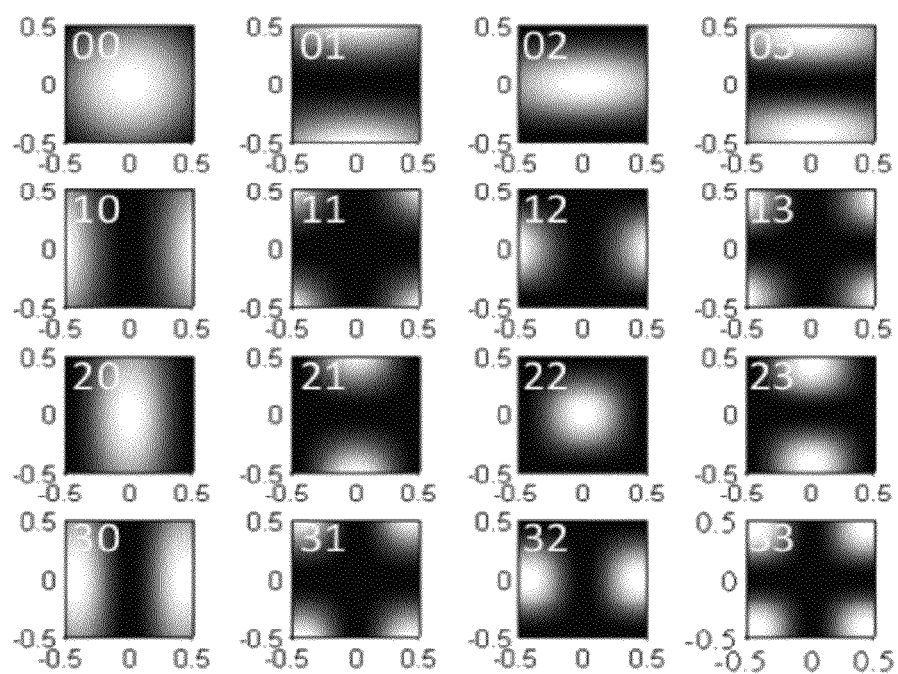
FIG. 4B shows examples of the use of Hermite-Gauss modes to create different shapes in accordance with various embodiments.

As discussed above, some embodiments may utilize a Gauss-Laguerre or "donut" mode that produces an isolated "dot" from an isolated round focus. FIG. 4A shows an example 480 of an isolated dot that can be produced utilizing a Gauss-Laguerre mode, similar to example 280 of FIG. 2C. Some embodiments may utilize other modes, such as Hermite-Gauss modes of various orders. FIG. 4B shows several examples of the use of Hermite-Gauss modes to allow the creation of other shapes, includes lines (such as 01, 02, 03, 10, 20, 04 30) that could be also rotated arbitrarily to produce lines at any desired angle. Note that this may fabricate a line of resist in a single exposure while the "donut" mode would require a series of superimposed dots. More complex patterns such can include crossed lines (such as 11 and 33 for example) are possible. This is not the only such set, but it illustrates that more complex beam shaping is possible and that it may have advantages of creating more complex patterns (than a dot) in a single exposure.

Some embodiments may utilize multiple exposures using an inhibiting wavelength of light. In some cases, a second optical pattern may restrict the change of the photoresponsive material to a small area, resulting in a small feature. In some cases, a more complex small pattern may be fabricated inside the diffraction limit. Multiple exposures may be used to create arbitrary, sub-diffraction patterns. In some embodiments, multiple, overlapping exposures may be utilized. In some embodiments, a shape of an inhibiting patterns may be altered between exposures. For example, one exposure might use a Gauss-Laguerre pattern that may tend to reduce the size of the features uniformly in all directions, then a second exposure might use a linear Hermite-Gaussian pattern that may only reduce the size of the features in one direction. This flexibility may result in a reduction in the number of multiple exposures.

There are a variety of different materials that may be used in accordance with various embodiments. Embodiments are not limited to the use of any particular material, provided it has the property that a first wavelength of light may alter the solubility of the material, while a second wavelength of light may hinder the first wavelength of light's ability to alter the solubility of the material. Different materials may respond to different light wavelengths depending on the specific chemistry of the material.

Some embodiments may comprise different photoresponsive organic materials. In some embodiments, the photoresponsive organic material may include a monomer. Merely by way of example, photoresponsive organic material may include triethylene glycol dimethacrylate ("TEGDMA"), a multifunctional monomer, which forms a crosslinked, gelled polymer upon polymerization via a free radical mechanism. In some embodiments, photoresponsive organic material may include a monomer that forms a polymer upon polymerization through other mechanisms well known to those skilled in the art. In some embodiments, a photoacid/photobase combination may be used, together with some latent acid/base inhibitor for each. This combination may work for SU-8, a common, epoxy-based negative photoresist, and even for positive photoresists, which may use light absorption by photoacid generators to which then cleave groups off polymer chains and effect a solubility change.

Figure 5A:
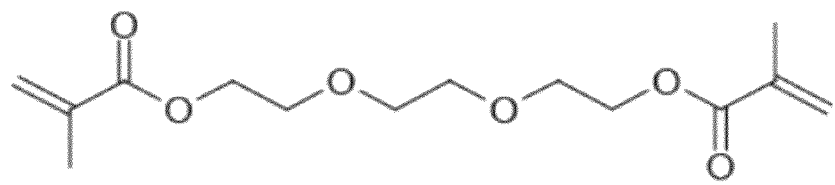
FIG. 5A shows a chemical figure of monomer TEGDMA in accordance with various embodiments.
Figure 5B:
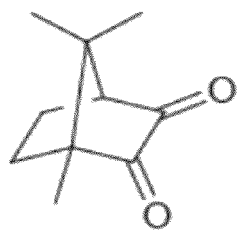
FIG. 5B shows a chemical figure of photoinitiator CQ in accordance with various embodiments.
Figure 5C:
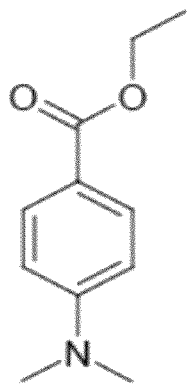
FIG. 5C shows a chemical figure of photoinitiator EDAB in accordance with various embodiments.
Figure 5D:
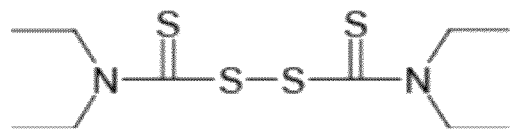
FIG. 5D shows a chemical figure of photoinhibitor TED in accordance with various embodiments.
Figure 5E:
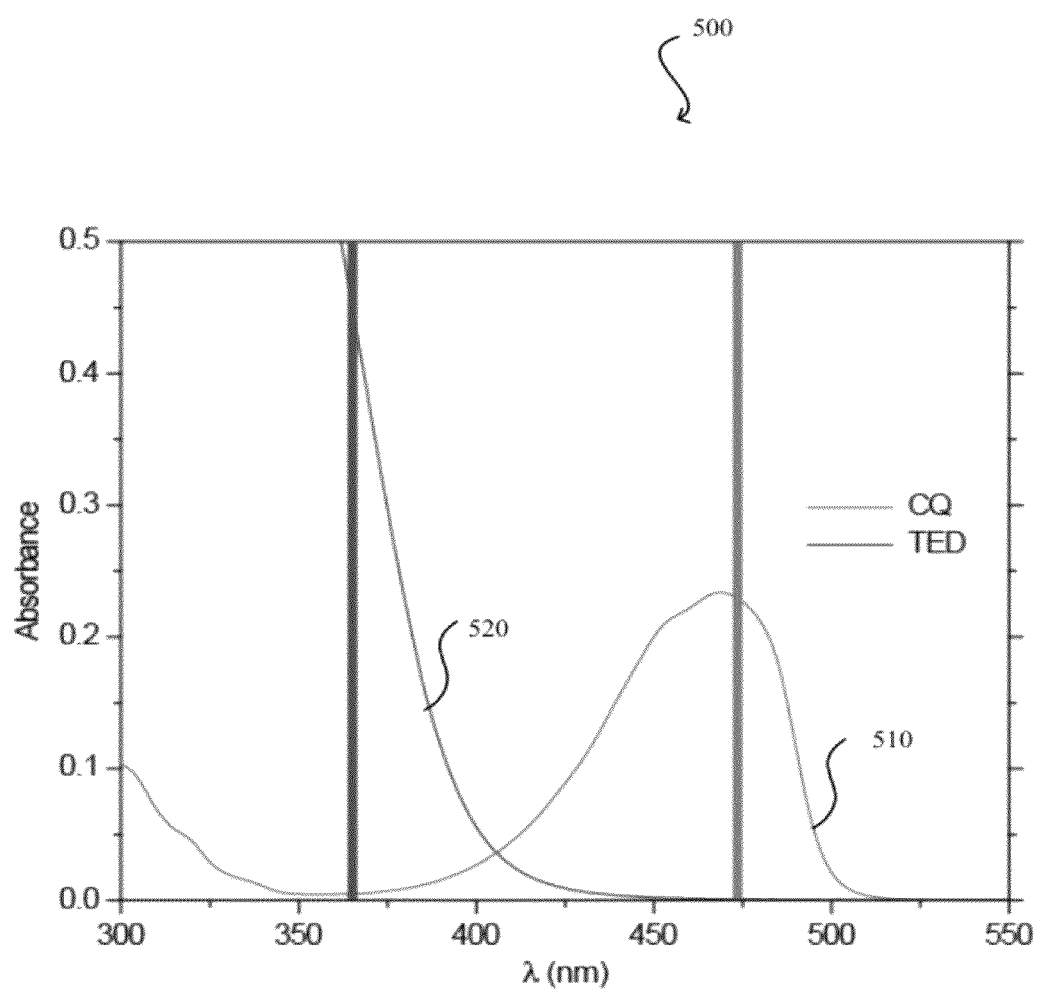
FIG. 5E shows a graph of the UV-Vis absorption spectra of CQ and TED in CHCl in accordance with various embodiments.

In some embodiments, a photoresponsive organic materials may also include a photointitiator and a photoinhibitor. In some embodiments, a photoinitiator may act to produce free radicals that may act to promote polymerization. In one embodiment, the photoresponsive organic material may include photoinitiators such as a camphorquinone ("CQ") and/or ethyl 4-(dimethylamino)benzoate ("EDAB"). These photointiatitors may act as a free radical photoinitiators. In some embodiments, a photoinhibitor may act to hinder the propagating radicals, thus slowing or stopping polymerization. In one embodiment, photoresponsive organic material may include tetraethylthiuram disulfide ("TED"), which may act as a photoinhibitor. In some embodiments, photointitiators and photoinhibitors may have complementary absorption windows, where they have regions of non-overlapping absorption. In some embodiments, photosensitizers may be used to modify the wavelength at which a photoinhibitor and/or the photoinhibitor are active. FIG. 5A shows diagram of monomer TEGDMA in accordance with various embodiments. FIG. 5B shows a diagram of photoinitiator CQ in accordance with various embodiments. FIG. 5C shows a diagram of photoinitiator EDAB in accordance with various embodiments. FIG. 5D shows a diagram of photoinhibitor TED in accordance with various embodiments. FIG. 5E shows a graph 500 of the UV-Vis absorption spectra of CQ 510 and TED 520 in CHCl, which can demonstrate the complementary absorption spectra of the photoinitiator CQ and the photoinhibitor TED, respectfully.

In one embodiment, a photoresponsive organic material of TEGDMA, TED, CQ, and EDAB performs well in concert as a photoinitiation/photoinhibition system. CQ has an absorbance peak around 470 nm (visible, blue) and absorbs poorly in the near UV whereas TED absorbs strongly in the near UV while it has zero absorbance at 470 nm. Thus, irradiating TEGDMA formulated with CQ/EDAB and TED with blue light excites the CQ and initiates the polymerization via carbon centered radicals whereas irradiation with UV photocleaves the TED, producing sulfur centered dithiocarbamyl (DTC) radicals which can terminate the polymerization.

The photoresponsive material of TEGDMA, TED, and CQ/EDAB as disclosed may produce a six-fold contrast between initiation and inhibition. The gel point, the point at which at least one molecule spans the entire polymer phase and becomes insoluble, can be used as a well-defined threshold for photo-lithography where the ungelled material is readily washed away while the gelled material remains. Thus, decreasing the polymerization rate to prevent gelation in unmasked regions may produce a photopatterned polymer despite universal exposure to the initiating wavelength.

Figure 6:
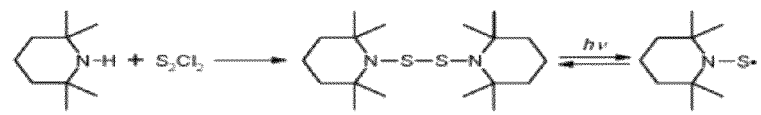
FIG. 6 is a chemical figure representing a class of photoinhibitors in accordance with various embodiments.

In some embodiments, a photoresponsive organic material may comprise photoinhibitors that are able, upon photolysis, to produce stable radicals unable to initiate polymerization but able to terminate the growing chain. In some embodiments, photoinhibitors may comprise a member of the class of bis(dialkylamino) disulfides as shown in FIG. 6. These disulfides undergo UV photolysis to form dialkylaminothiyl radicals. These radicals couple at or near the diffusion-controlled limit with both each other (head-to-head dimerization) and with other radical species but are extremely unreactive toward many molecular substrates, such as (meth)acrylates, that react readily with a majority of free radicals, thus appearing to satisfy the requirements of an ideal photoinhibitor.

Diffraction unlimited photolithography in accordance with various embodiments may be utilized for numerous different applications. For example, some embodiments may be utilized for 2D structuring of a photoresponsive material such as a photoresist. Some embodiments may be utilized for 3D structuring in which the focus may be dragged around in a 3D volume. Unreacted liquid may be removed via solvent in some cases. Some embodiments may include two or three-D index structuring of solid hosts. In this case, the reaction can cause diffusion of a small molecular-weight component which locally raises the index of refraction. No solvent wash may be needed in this case. This approach can be used for data storage in which small index changes are recorded in the volume of a thick disk, for example. In addition, some embodiments may be used for integrated optics in which a pattern of light creates waveguides and other circuit elements.

Figure 7:
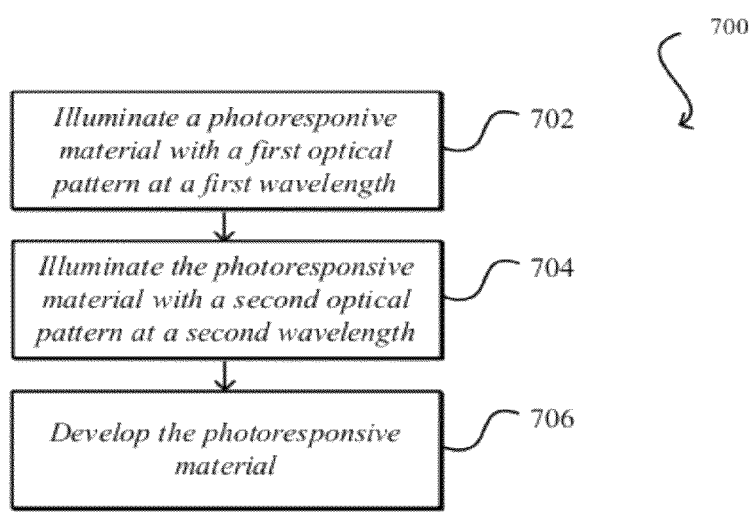
FIG. 7 shows a flow diagram of a method of fabrication in accordance with various embodiments.

FIG. 7 shows a flow diagram of a method 700 of photofabrication. Method 700 may be implemented utilizing systems such as system 100 of FIG. 1, system 200 of FIG. 2A, and/or system 300 of FIG. 3A, for example. Method 700 may also utilize materials such as those seen in FIG. 5A-5D and/or FIG. 6 for example. At block 702, a photoresponsive material is illuminated with a first optical pattern at a first wavelength of light. The first wavelength of light alters a solubility of the photoresponsive material through the interaction of the first wavelength of light with a photoinitiator of the photoresponsive material. At block 704, the photoresponsive material is illuminated with a second optical pattern at a second wavelength of light. The second optical pattern overlaps the first optical pattern. The second wavelength of light hinders the ability of the first wavelength of light to alter the solubility of the photoresponsive material through the interaction of the second wavelength of light with a photoinhibitor of the photoresponsive material. In some cases, illuminating with the first optical pattern and illuminating with the second optical pattern may occur at the same time, while in other cases, the illuminating may occur sequentially. At block 706, the photoresponsive material is developed.

In some embodiments, method 700 may include a photoinitiator that produces free radicals when illuminated with the first wavelength of light. In some embodiments, the photoinhibitor hinders the ability of the free radicals to initiate polymerization when the photoinhibitor is illuminated with the second wavelength of light. The photoinitiator may include a combination of camphorquinone and ethyl 4-(dimethylamino)benzoate; in some cases, camphorquinone may be referred to as the photoinitiator while ethyl 4-(dimethylamino)benzoate may be referred to as a co-initiator. The photoinhibitor may include tetraethylthiuram disulfide. The photoinhibitor may include bis(dialkylamino)disulfide.

In some embodiments, method 7000 utilizes a second optical pattern that includes a Gauss-Laguerre pattern. In some embodiments, the second optical pattern includes a Hermite-Gauss pattern. In some embodiments, the photoresponsive material may be illuminated with a third optical pattern at the second wavelength of light. The third optical pattern may overlap the first optical pattern. Some embodiments may illuminate the photoresponsive material utilizing a direct-write illumination system. Some embodiments may illuminate the photoresponsive material utilizing a mask-based illumination system.

Figure 8:
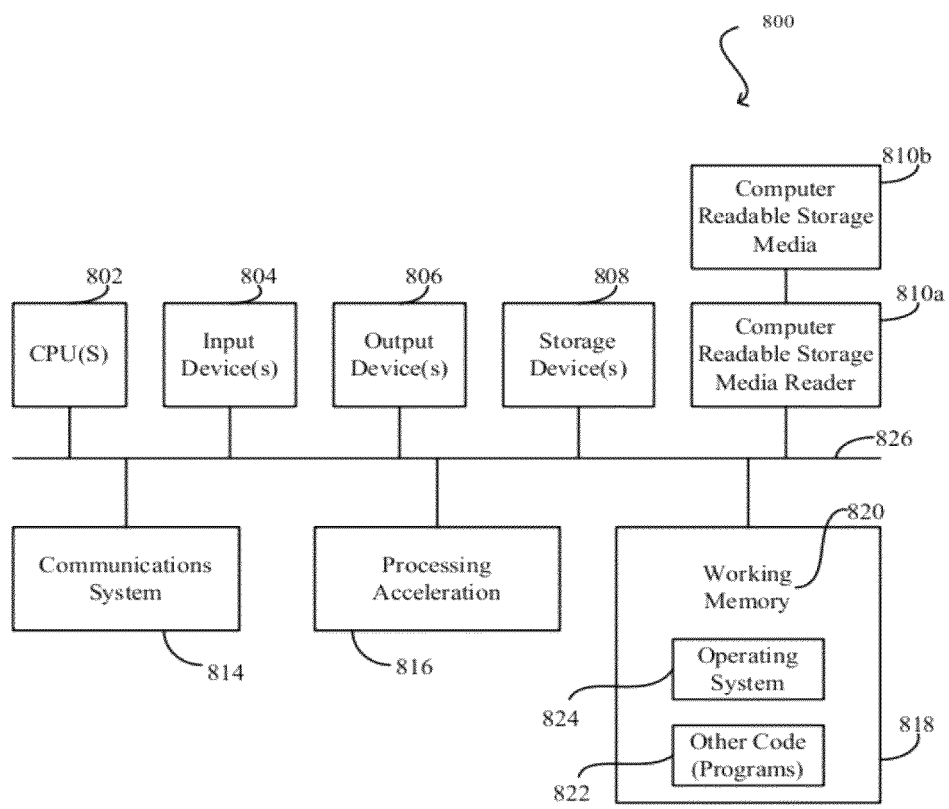
FIG. 8 shows a general-purpose computer system in accordance with various embodiments.

The methods and systems described in connection with method 700 and systems 100, 200, and 300 may be implemented in part by using a computer system 800 such as shown schematically in FIG. 8, which broadly illustrates how individual system elements may be implemented in a separated or more integrated manner. The system 800 is shown comprised of hardware elements that may be electrically coupled via bus 826. The hardware elements may include a processor 802, an input device 804, an output device 806, a storage device 808, a computer-readable storage media reader 810a, a communications system 814, a processing acceleration unit 816 such as a DSP or special-purpose processor, and a memory 818. The computer-readable storage media reader 810a may be further connected to a computer-readable storage medium 810b, the combination comprehensively representing remote, local, fixed, and/or removable storage devices plus storage media for temporarily and/or more permanently containing computer-readable information. The communications system 814 may comprise a wired, wireless, modem, and/or other type of interfacing connection and may be utilized to allow system 800 to control different aspects of systems 100, 200, and/or 300, or implement methods such as method 700.

The system 800 may also include software elements, shown as being currently located within working memory 820, which may include an operating system 824 and other code 822, such as a program designed to implement methods of different embodiments. Merely by way of example, system 800 may include processing code that may include instructions to direct a system such as system 100, 200, and/or 300 to illuminate a photoresponsive material with a first optical pattern at a first wavelength and illuminate the photoresponsive material with a second optical pattern at a second wavelength. It will be apparent to those skilled in the art that substantial variations may be used in accordance with specific requirements. For example, customized hardware might also be used and/or particular elements might be implemented in hardware, software (including portable software, such as applets), or both. Further, connection to other computing devices such as network input/output devices may be employed.

The previous description provides exemplary embodiments only, and is not intended to limit the scope, applicability, or configuration of the disclosure. Rather, the previous description of the exemplary embodiments will provide those skilled in the art with an enabling description for implementing one or more exemplary embodiments. It is understood that various changes may be made in the function and arrangement of elements without departing from the spirit and scope of the invention. Several embodiments were described herein, and while various features are ascribed to different embodiments, it should be appreciated that the features described with respect to one embodiment may be incorporated within other embodiments as well. By the same token, however, no single feature or features of any described embodiment should be considered essential to every embodiment of the invention, as other embodiments of the invention may omit such features.

Specific details are given in the previous description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have also included additional steps or operations not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

While detailed descriptions of one or more embodiments have been give above, various alternatives, modifications, and equivalents will be apparent to those skilled in the art without varying from the spirit of the invention. Moreover, except where clearly inappropriate or otherwise expressly noted, it should be assumed that the features, devices, and/or components of different embodiments may be substituted and/or combined. Thus, the above description should not be taken as limiting the scope of the invention.

What is claimed is:

1. A method of photo fabrication, comprising:
   illuminating a photoresponsive material with a first optical pattern at a first wavelength of light, wherein the first wavelength of light alters a solubility of the photoresponsive material through the interaction of the first wavelength of light with a photoinitiator of the photoresponsive material, and wherein the photoinitiator comprises a disulfide selected from the group consisting of tetraethylthiuram disulfide and bis(dialkylamino) disulfide;
   illuminating the photoresponsive material with a second optical pattern at a second wavelength of light, wherein:
     the second optical pattern overlaps the first optical pattern; and
     the second wavelength of light hinders the ability of the first wavelength of light to alter the solubility of the photoresponsive material through the interaction of the second wavelength of light with a photoinhibitor of the photoresponsive material; and
   developing the photoresponsive material.

2. The method of photo fabrication as in claim 1, wherein the photoinitiator produces free radicals when illuminated with the first wavelength of light.

3. The method of photo fabrication of claim 2, wherein the photoinhibitor traps free radicals when illuminated with the second wavelength of light.

4. The method of photo fabrication of claim 3, wherein the photoinitiator comprises at least camphorquinone or ethyl 4-(dimethylamino)benzoate.

5. The method of photo fabrication as in claim 1, wherein the second optical pattern comprises a Gauss-Laguerre pattern.

6. The method of photo fabrication as in claim 1, wherein the second optical pattern comprises a Hermite-Gauss pattern.

7. The method of photo fabrication as in claim 1, wherein illuminating the photoresponsive material utilizes a direct-write illumination system.

8. The method of photo fabrication as in claim 1, wherein illuminating the photoresponsive material utilizes a mask-based illumination system.

9. A method of photo fabrication, comprising:
   illuminating a photoresponsive material with a first optical pattern at a first wavelength of light, wherein the first wavelength of light alters a solubility of the photoresponsive material through the interaction of the first wavelength of light with a photoinitiator of the photoresponsive material;
   illuminating the photoresponsive material with a second optical pattern at a second wavelength of light, wherein:
     the second optical pattern comprises a Gaussian pattern;
     the second optical pattern overlaps the first optical pattern; and
     the second wavelength of light hinders the ability of the first wavelength of light to alter the solubility of the photoresponsive material through the interaction of the second wavelength of light with a photoinhibitor of the photoresponsive material; and
   developing the photoresponsive material.

10. The method of photo fabrication as in claim 9, wherein the photoinitiator produces free radicals when illuminated with the first wavelength of light.

11. The method of photo fabrication of claim 10, wherein the photoinhibitor traps free radicals when illuminated with the second wavelength of light.

12. The method of photo fabrication as in claim 9, wherein the second optical pattern comprises a Gauss-Laguerre pattern.

13. The method of photo fabrication as in claim 9, wherein the second optical pattern comprises a Hermite-Gauss pattern.

14. The method of photo fabrication as in claim 9, wherein illuminating the photoresponsive material utilizes a direct-write illumination system.

15. The method of photo fabrication as in claim 9, wherein illuminating the photoresponsive material utilizes a mask-based illumination system.

16. A method of photo fabrication, comprising:
illuminating a photoresponsive material with a first optical pattern at a first wavelength of light, wherein the first wavelength of light alters a solubility of the photoresponsive material through the interaction of the first wavelength of light with a photoinitiator of the photoresponsive material;
illuminating the photoresponsive material with a second optical pattern at a second wavelength of light, wherein:
the second optical pattern comprises a pattern selected from the group consisting of a Gauss-Laguerre pattern and a Hermite-Gauss pattern;
the second optical pattern overlaps the first optical pattern; and
the second wavelength of light hinders the ability of the first wavelength of light to alter the solubility of the photoresponsive material through the interaction of the second wavelength of light with a photoinhibitor of the photoresponsive material; and
developing the photoresponsive material.

17. The method of photo fabrication as in claim 16, wherein the photoinitiator produces free radicals when illuminated with the first wavelength of light.

18. The method of photo fabrication of claim 17, wherein the photoinhibitor traps free radicals when illuminated with the second wavelength of light.

19. The method of photo fabrication of claim 18, wherein the photoinitiator comprises at least camphorquinone or ethyl 4-(dimethylamino)benzoate.

20. The method of photo fabrication of 19, wherein the photoinhibitor comprises tetraethylthiuram disulfide.

21. The method of photo fabrication of claim 19, wherein the photoinhibitor comprises bis(dialkylamino) disulfide.

22. The method of photo fabrication as in claim 16, wherein illuminating the photoresponsive material utilizes a direct-write illumination system.

23. The method of photo fabrication as in claim 16, wherein illuminating the photoresponsive material utilizes a mask-based illumination system.

* * * * *